(12) United States Patent
Vieux et al.

(10) Patent No.: US 6,335,528 B1
(45) Date of Patent: Jan. 1, 2002

(54) METHOD FOR PRODUCING A RADIATION DETECTOR BY ASSEMBLING ELEMENTARY BLOCKS AND RESULTING DETECTOR

(75) Inventors: Gérard Vieux, Froges; André Nicollet, Grenoble; Vincent Spinnler, Voreppe, all of (FR)

(73) Assignee: Thomson Tubes Electroniques, Meudon la Foret (FR)

( * ) Notice: Subject to any disclaimer, the term of this patent is extended or adjusted under 35 U.S.C. 154(b) by 0 days.

(21) Appl. No.: 09/341,681

(22) PCT Filed: Jan. 20, 1998

(86) PCT No.: PCT/FR98/00099
§ 371 Date: Jul. 21, 1999
§ 102(e) Date: Jul. 21, 1999

(87) PCT Pub. No.: WO98/32180
PCT Pub. Date: Jul. 23, 1998

(30) Foreign Application Priority Data

Jan. 21, 1997 (FR) .............................. 97 00594

(51) Int. Cl.$^7$ ............................ H01L 25/065
(52) U.S. Cl. ............. 250/370.11; 250/370.09; 250/367
(58) Field of Search ................ 250/370.11, 370.09, 250/367, 368, 366

(56) References Cited

U.S. PATENT DOCUMENTS

| | | | | |
|---|---|---|---|---|
| 4,870,279 A | * | 9/1989 | Cueman et al. | 250/368 |
| 4,999,484 A | | 3/1991 | Kaneko | |
| 5,369,281 A | | 11/1994 | Spinnler et al. | |
| 5,381,014 A | | 1/1995 | Jeromin et al. | |
| 5,831,269 A | * | 11/1998 | Nkamura et al. | 250/367 |
| 6,031,234 A | * | 2/2000 | Albagli et al. | 250/370.11 |
| 6,180,944 B1 | * | 1/2001 | Robinson et al. | 250/370.09 |

FOREIGN PATENT DOCUMENTS

| | | |
|---|---|---|
| EP | 0 529 981 A | 3/1993 |
| FR | 2 687 494 | 2/1992 |
| FR | 2 471 610 A | 6/1998 |
| FR | 2 636 800 | 9/1998 |

* cited by examiner

Primary Examiner—Constantine Hannaher
Assistant Examiner—Otilia Gabor
(74) Attorney, Agent, or Firm—Oblon, Spivak, McClelland, Maier & Neustadt, P.C.

(57) ABSTRACT

A process for producing a radiation detector. A plurality of unitary elementary slabs are assembled on a positioning support. The slabs are adhesively bonded onto the common support. The bonding is carried out in two successive steps: a first step for sealing the inter-slab spaces without filling them entirely, and a second step intended to spread a film of adhesive over the entire surface of the assembled slabs. A subsequent step includes fitting the common support.

10 Claims, 3 Drawing Sheets

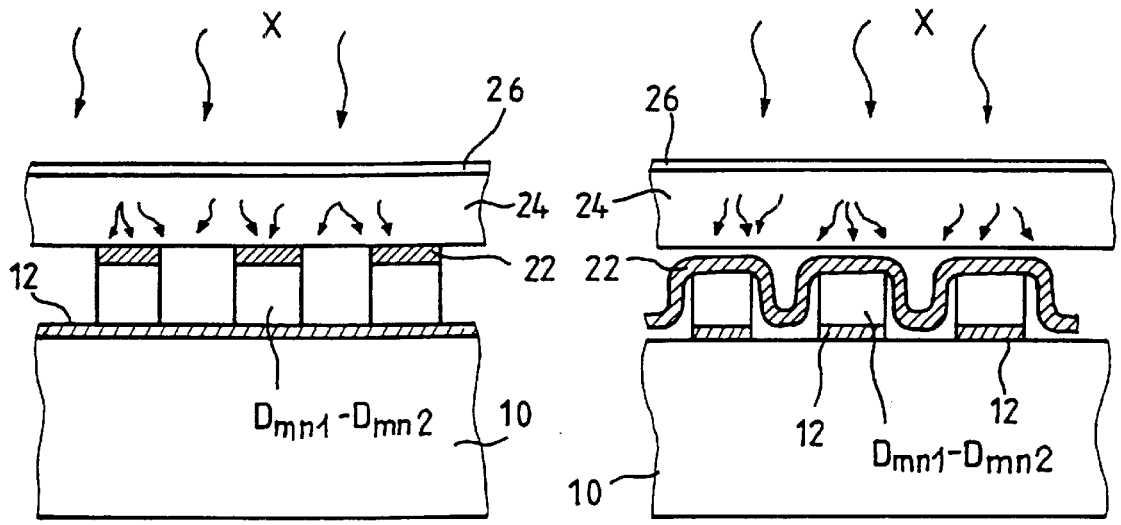
PRIOR ART FIG_1a  PRIOR ART FIG_1b
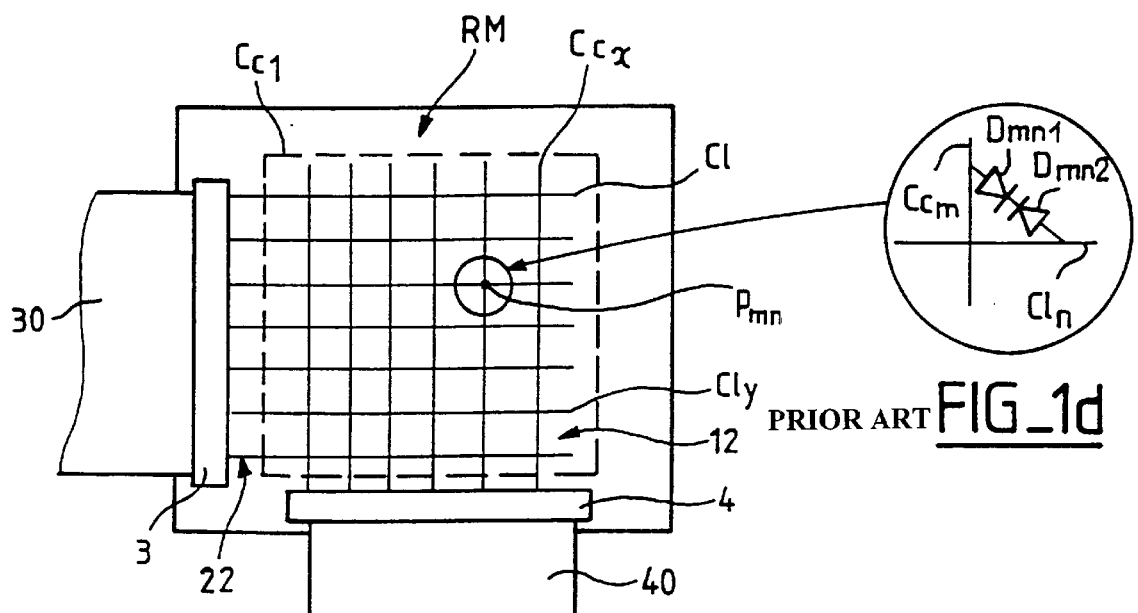
PRIOR ART FIG_1c  PRIOR ART FIG_1d

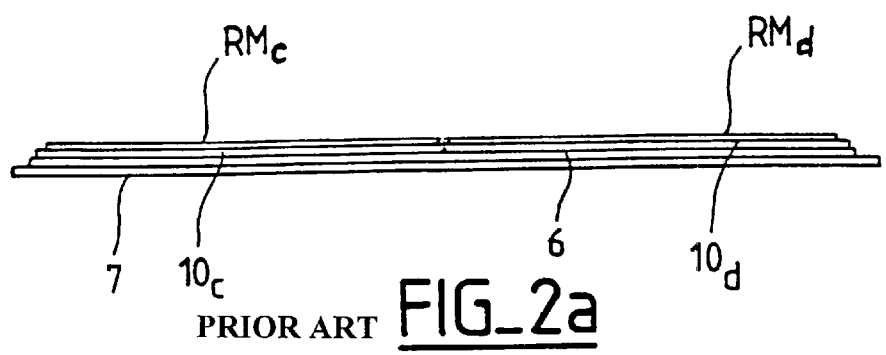
PRIOR ART FIG_2a
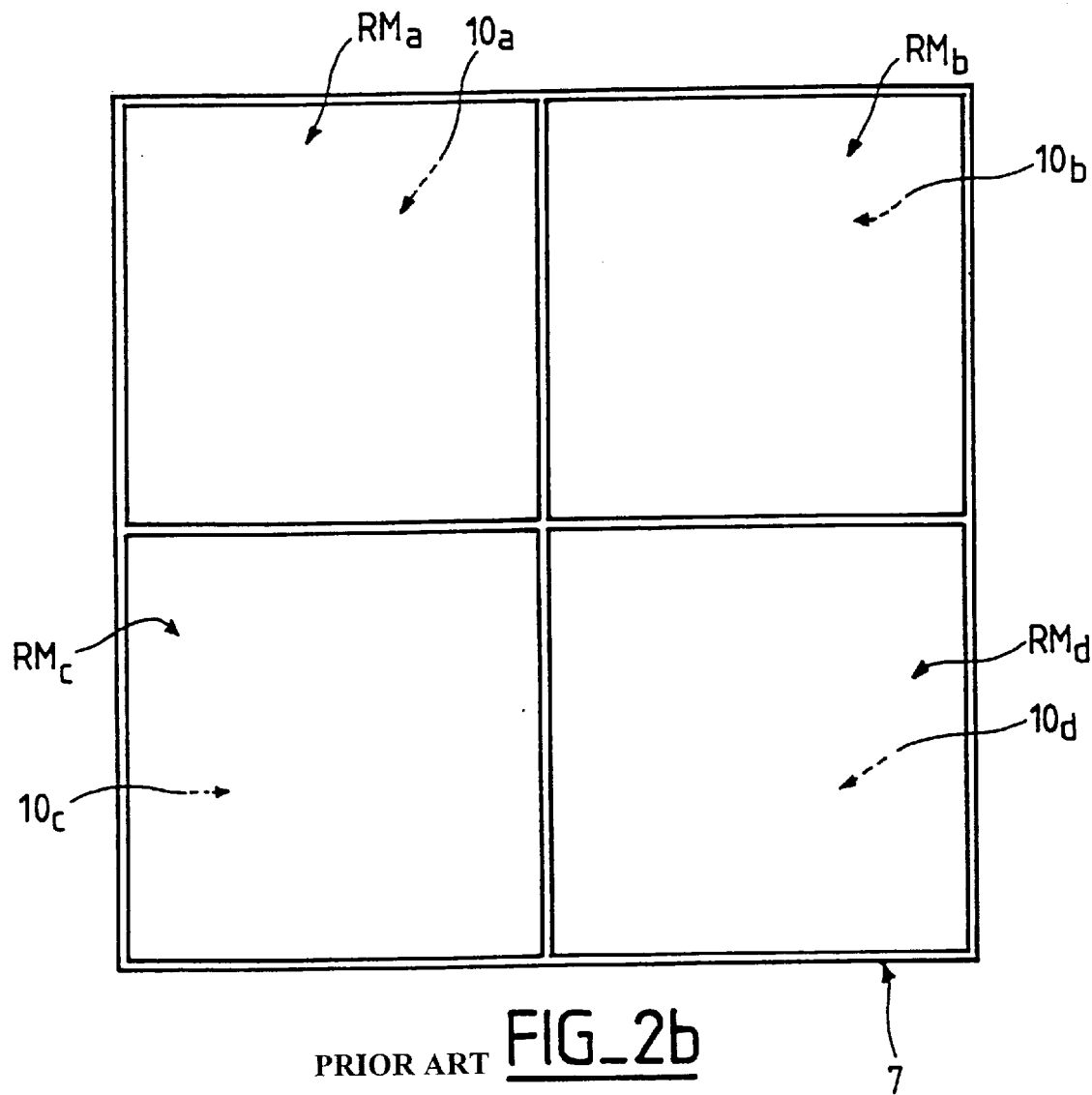
PRIOR ART FIG_2b

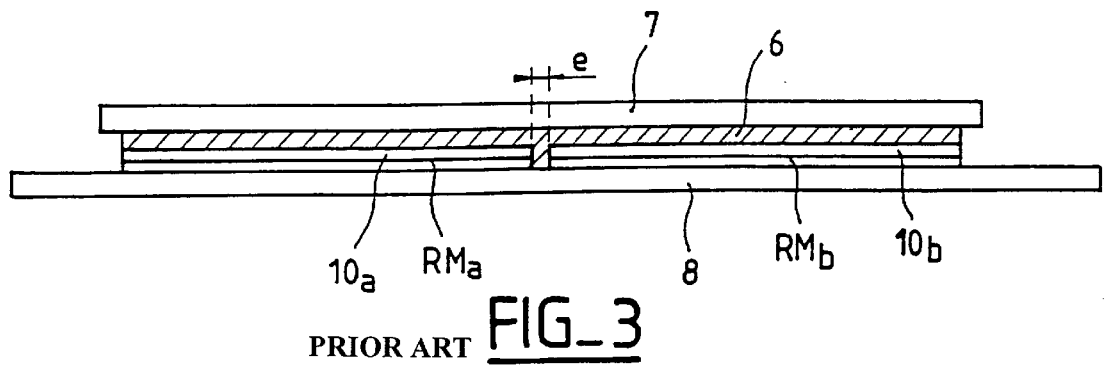
PRIOR ART FIG_3
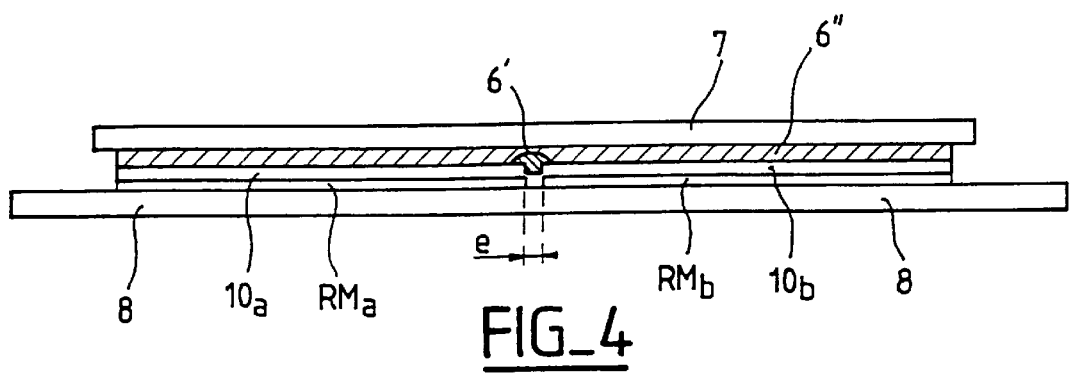
FIG_4
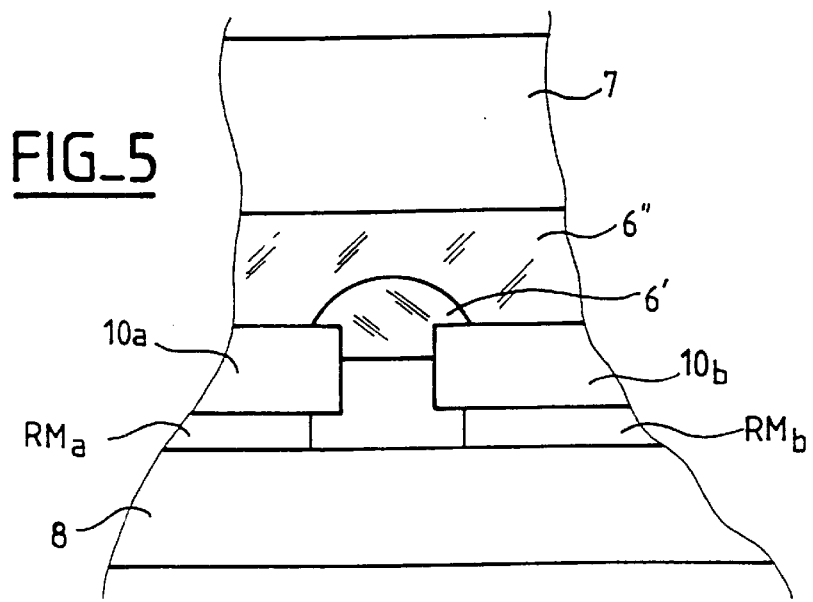
FIG_5

METHOD FOR PRODUCING A RADIATION DETECTOR BY ASSEMBLING ELEMENTARY BLOCKS AND RESULTING DETECTOR

BACKGROUND OF THE INVENTION

FIELD OF THE INVENTION

The present invention relates to a process for producing a solid-state radiation detector by assembling unitary elementary slabs in order to obtain a composite slab of large size, and it more particularly relates to a process for adhesively bonding these unitary elementary slabs.

The invention also relates to a detector thus produced.

DISCUSSION OF THE BACKGROUND

The principal application of such detectors is X-ray radiology. To give a concrete idea, in what follows, without limiting its scope in any way by this, the context of the preferred application of the invention will be assumed, unless otherwise indicated.

A scintillator according to the prior art is described by way of nonlimiting example, in French patent application FR-A-2 636 800 (THOMSON-CSF).

The mode of operation and the general structure of a solid-state X-radiation detector will now be sumarized with a reference to the description of FIGS. 1a to 3 appended [lacuna] the present description.

According to the state of the art, radiation detectors are produced on the basis of one or more matrices of solid-state photosensitive elements. Known solid-state photosensitive elements are not directly sensitive to rays with very short wavelengths, as X-rays are. It is necessary to combine them with a scintillator component. The latter is made of a substrate which has the property, when it is excited by X-rays, of emitting light in a range of longer wavelengths: in the visible spectrum (or the near visible spectrum). The particular wavelength depends on the substance used. The scintillator therefore acts as a wavelength converter. The visible light thus generated is transmitted to the photosensitive elements which carries out photoelectric conversion of the received light energy into electric signals which can be processed by suitable electronic circuits.

FIGS. 1a and 1b represent two mutually orthogonal lateral sections of a matrix of photosensitive elements which is conventionally combined with a sheet of scintillating substance.

Each photosensitive element has a photodiode or a phototransistor which is sensitive to photons in the visible spectrum or the near visible spectrum. By way of example, as illustrated in FIGS. 1a to 1d, each photosensitive element consists, for example, of two diodes $D_{mn1}$ and $D_{mn2}$ which are arranged head-to-tail, and the matrix array RM has column conductors, $Cc_1$ to $Cc_x$, and row conductors, $Cl_1$ to $Cl_y$. Each of the diodes $D_{mn1}$ and $D_{mn2}$ constitutes, in a known way, a capacitor when it is reverse-biased. The first diode $D_{mn1}$ has a capacitance typically ten times smaller than the capacitance of the second diode $D_{mn2}$. It principally fulfills the function of a switch, whereas the second diode is preferably photodetecting.

At each intersection of a row and a column, for example of row $Cl_n$ and column $Cc_m$ (see FIG. 1d), such a set of two diodes head-to-tail, $D_{mn1}$ and $D_{mn2}$, is arranged. The diodes can be replaced by transistors produced in "TFT" technology, TFT standing for thin film transistor.

The conductors 12 (FIGS. 1a and 1b) consist of a metal deposit on an insulating substrate 10, preferably glass. The deposition is followed by a photoetching operation in order to obtain parallel conductive tracks of suitable width. The diodes (for example $D_{mn1}$ and $D_{mn2}$) are formed by deposition, on the column conductive tracks 12, then etching, of the layers of amorphous silicon (ASi) which is intrinsic or doped using P or N type semiconductor material. A very thin layer of conducting, preferably transparent material is deposited on the insulating layer 20 in order to form, after etching, the row conductive tracks 22 of the matrix array RM.

The assembly described above forms what is generally referred to as the unitary elementary "amorphous silicon slabs".

The row conductors $Cl_1$–$Cl_x$ and the column conductors $Cc_1$–$Cc_y$ constitute the electrodes for biasing the diode capacitors. The latter store electric charges when they are subjected to light radiation and deliver an electric signal, proportional to the stored charge, when they are electrically biased. The row conductors $Cc_1$–$Cc_x$ and the column conductors $Cc_1$–$Cc_y$ are addressed in a suitable chronological sequence, so that all the pixels $p_{mn}$ are biased sequentially in a predetermined order. The signal delivered by each pixel $p_{mn}$ is thus recovered and processed by electronic circuits (not shown) so as to reconstruct (point by point) the image stored in the form of electric charges.

The signals are recovered in respective connection zones 3 and 4, for the rows $Cl_1$–$Cl_x$ and the columns $Cc_1$–$Cc_y$. The connections with the external electronic circuits may be made using flexible multiconductor cables, 30 and 40, respectively.

It is generally necessary to provide sequences referred to as "optical relevelling" of the pixels $p_{mn}$, once the signals have been delivered by them. The chronological sequence of the addressing signals is adapted accordingly. Optical relevelling sequences are inserted between the reading signals. They consist in performing generalized illumination of the pixels $p_{mn}$, after reading. The purpose of these sequences is to re-establish an electrical reference state on the pixels $p_{mn}$ which have been perturbed during the phases of storing and reading the charges.

This generalized illumination is performed via the rear face of the glass slab 10, which must be sufficiently transparent at the wavelengths of the light which is used.

As indicated above, the photosensitive elements need to be illuminated with visible light (or in a range close to visible light). It is necessary to provide a scintillator which converts the X-rays into light energy, in the visible-wavelengths spectrum. To that end, it is sufficient to cover the amorphous silicon slab described above with a layer of scintillating substance 24. By way of example, for a detector sensitive to X-rays of the order of 60 KeV [sic], the scintillating substance used is cesium iodide (CsI) doped with sodium iodide (NaI) or thallium iodide (TiI), depending on whether the intention is to obtain a light signal of wavelength 390 nm or 550 nm, respectively.

The amorphous silicon slab which has just been described is produced by vacuum evaporation of thin films of material on the glass slab. The dimensions of the glass slab must be compatible with the current dimensional capacities of machines for carrying out the deposition.

However, the need has been felt to provide slabs with large sizes, these sizes being incompatible with the aforementioned deposition machines. It is thus necessary to resort to unitary elementary slabs, of smaller sizes, which are assembled by juxtaposition with one another. By way of nonlimiting example, a chequer-board of four elementary unitary slabs is assembled in order to form a composite slab of large size. Such an assembly process is described, for example, in French patent application FR-A-2 687 494 (THOMSON TUBES ELECTRONIQUES). The unitary slabs preserve their autonomy as regards the addressing of their own pixels $p_{mn}$.

FIGS. 2a and 2b appended to the present description illustrate such an assembly, respectively in side and plan view. In the example described, the composite slab of large size comprises four unitary elementary slabs $10_a$ to $10_d$.

The unitary elementary slabs $10_a$ to $10_d$ are cut precisely on two sides of their periphery which are free of the connection zone (not shown) so that the active zones of pixels, $RM_a$ to $RM_d$, are flush with the edge of the cut slab. The cut slabs $10_a$ to $10_d$ are then positioned relative to one another in order to preserve continuity of the active zone of the pixels and their pitch, from one slab to the next.

The assembly is carried out by adhesive bonding (film 6) of a common support 7 on the cut and positioned slabs $10_a$ to $10_d$. This support 7 must also be transparent enough to visible light in order to allow optical relevelling of pixels of all the unitary slabs thus assembled.

The simplest method for producing the scintillator is to deposit a layer of doped caesium iodide (CsI) on any desired substrate, to anneal this substrate in order to obtain the desired luminescence properties and to attach this scintillator-substrate assembly against the adhesively bonded assembly. The scintillator may be attached or coupled optically to the slab by adhesive bonding.

The performance obtained with a scintillator produced in this way is, however, mediocre especially in terms of isolation. This is because refraction is observed of the visible light output by the scintillator, either in the thickness of the adhesive, in the case of coupling to the slab, or in the thickness of the air layer which is difficult to control in the case of pressing onto the slab.

Another method for producing the scintillator consists in producing the scintillator by direct evaporation of a scintillating substance onto the composite slab obtained by assembling and adhesively bonding the elementary slabs $10_a$ to $10_d$. This solution has the advantage of a scintillator in intimate contact with this composite slab. The scattering of light at the scintillator/slab interface and the loss of resolution which results from this are minimized.

The adhesively bonded assembly thus obtained will have to experience environmental, thermal and mechanical stresses. It must withstand impact vibrations and jolts. The film of adhesive 6 must be flexible enough to withstand these mechanical stresses. In order to allow the pixels $p_{mn}$ to be optically relevelled via the rear face of the slabs $10_a$ to $10_d$, the film of adhesive 6 must furthermore be transparent enough to the visible light used for this optical relevelling.

Lastly, when the scintillator is produced by direct evaporation, the adhesively bonded assembly undergoes luminescence annealing of the caesium iodide layer (CsI). The film of adhesive must therefore withstand the annealing temperature. It must be also be flexible enough to withstand the difference in coefficients of expansion of the materials to be adhesively bonded (unitary slabs $10_a$ to $10_d$ and common support 7) which are a priori different.

In order to satisfy these requirements, use may be made of a two-component silicon resin which polymerizes by polyaddition, in order to carry out the adhesive bonding.

The multislab detectors of large size which are produced according to the process which has just been summarized, therefore comprise the following steps, illustrated schematically with reference to FIG. 3 appended to the present description:

a/ unitary elementary slabs $10_a$ to $10_d$ (only two of which, $10_a$ and $10_b$, can be seen in FIG. 3) are positioned relative to one another on a substrate 8 (referred to as a positioning substrate): the pitch of the pixels $p_{mn}$ must be respected, the inter-slab spaces e typically lying in the 10 to 100 μm range;

b/ a film of adhesive 6 is spread over the assembly thus formed;

c/ the common support 7 is then fitted on the assembly.

This process does, however, have drawbacks. Specifically, because of the fluidity of the adhesive, it most often penetrates between the unitary elementary slabs (in the spaces e) and spreads over their faces which are covered with the semiconductor deposits (for example the matrix arrays $RM_a$ and $RM_b$ which can be seen in FIG. 3).

This problem must be avoided. The degradation of the clean condition and the topography which result therefrom are incompatible with the deposition of the scintillating substance over all the unitary elementary slabs, either in the case of an attached scintillator or in the case of a scintillator produced by direct evaporation.

SUMMARY OF THE INVENTION

The subject of the invention is to overcome the drawbacks which result from the processes for producing detectors according to the prior art.

To that end, the adhesive bonding according to the process of the invention is carried out in two stages. In a first stage, the inter-slab spaces are sealed by a first type of adhesive, without filling them entirely. In a second stage, the adhesive bonding proper is carried out by using a second type of adhesive.

The invention therefore relates to a process for producing a radiation detector consisting of the combination of a photosensitive component and a scintillator, the said photosensitive component consisting of at least two unitary elementary slabs, each unitary elementary slab containing a plurality of active elements or pixels and the edges of two adjacent slabs being separated by a determined inter-slab space, the process comprising at least the following phases:

a/ juxtaposition of the said unitary elementary slabs on a positioning substrate in order to form a composite slab of larger size whose unitary elementary slabs are separated from one another by the said determined inter-slab space, the said plurality of active elements or pixels being placed in contact with the positioning substrate;

b/ adhesively bonding the said composite slab onto a common support;

characterized in that the said adhesive-bonding phase comprises, in sequence:

a first adhesive-bonding step consisting in sealing the said determined inter-slab spaces by forming a bead of adhesive, leaving a free zone between its lower end and the said positioning substrate;

and a second adhesive-bonding step consisting in spreading a film of adhesive covering the said unitary elementary slabs and the said bead of sealing adhesive.

Advantageously, the adhesive used in the first step is a high-viscosity adhesive (under ambient temperature and pressure conditions) and the adhesive used in the second step is an adhesive with much lower viscosity (an adhesive which is fluid under the deposition conditions). The bead of adhesive deposited in the first step can thus fulfil the function of a plug filling the upper part of the gaps between slabs, and the second layer of adhesive does not penetrate into these gaps.

The invention also relates to a radiography detector produced according to this process.

BRIEF DESCRIPTION OF THE DRAWINGS

The invention will be understood more clearly and other characteristics and advantages will become apparent on reading the following description with reference to the appended figures, in which:

FIGS. 1a to 2b schematically illustrate the mode of operation and the structure of a radiography detector according to the prior art;

FIG. 3 illustrates, with reference to a detector of large size consisting of a plurality of elementary slabs, a process for adhesively bonding these slabs according to the prior art;

FIG. 4 illustrates the adhesive-bonding process according to the invention;

FIG. 5 is an enlarged detail of a detector obtained according to the adhesive-bonding process of the invention;

FIGS. 4 and 5 illustrate an embodiment example of a detector produced according to the invention.

DETAILED DESCRIPTION OF THE PREFERRED EMBODIMENTS

The general structure of a detector of large size, as summarized with reference to FIGS. 1a to 3, is retained. The elements in common with the prior art detector in FIG. 3 have the same references and will only be re-described as required.

According to an important characteristic of the invention, the adhesive bonding now includes two separate successive steps.

The first adhesive-bonding step has the purpose of sealing the inter-slab spaces e, without filling them entirely. To that end, in a preferred variant of the invention, use is made of a first type of adhesive consisting of a material with high viscosity (or possibly a thixotropic material).

FIG. 5 more particularly illustrates an inter-slab zone e on an enlarged scale. It can be seen that, following the first adhesive-bonding step, a bead of adhesive 6' joining the upper edges of two adjacent slabs 10a and 10b is formed. This bead leaves an unfilled zone Z remaining between its lower wall and the positioning substrate 8. This bead 6', which therefore only fills the upper zone of the inter-slab space e, will fulfil the function of "plug", for the adhesive spread during the second adhesive-bonding step.

The second adhesive-bonding step has the purpose of producing the adhesive bonding proper. It is similar to the single adhesive-bonding step according to the prior art. To that end, a second type of adhesive is used which is fluid enough for it to be able to spread over the upper surface of all the unitary elementary slabs and their amorphous semiconductor layers (matrix arrays of pixels) $10_a$-$RM_a$ to $10_d$-$RM_d$ (see FIG. 2b). A surface film of adhesive 6" is then obtained.

The next step for the production of the detector consists in fitting the common support on the surface film of adhesive 6". This step is identical to the corresponding step in the prior art.

Naturally, the adhesives used need to satisfy the various requirements and constraints summarized above: in particular, optical transparency to visible light, mechanical flexibility and thermal stability in the case of a scintillator produced by direct evaporation.

Lastly, the two types of adhesive need to be compatible with each other.

For the first step, a thixotropic resin or gel may be used which has the required properties of flexibility, optical transparency and thermal stability (if necessary).

For the second step, a two-component silicon resin may be used. This resin polymerizes by polyaddition. After polymerization it satisfies the requirements set out above.

According to a second variant of the process of the invention, it is possible to use the same two-component silicon resin, but at differently advanced degrees of polymerization. A partially polymerized adhesive is used for the first step, so that it is viscous enough not to fill the inter-slab spaces down to their bottom and to form the beads 6'. The time needed for prepolymerization depends, naturally, on the temperature. By way of example, for a temperature of the order of 35° C., the prepolymerization time is about 2 hours. This same type of adhesive, but unpolymerized, is used for the second step. This adhesive, being in the fluid state, therefore spreads over the upper face of the slabs, for example 10a and 10b, in order to form the uniform film 6".

The polymerization process is then continued.

On reading the description above, it is easy to see that the invention does indeed achieve its object.

While retaining the advantages of the adhesive-bonding processes according to the prior art, which satisfy in particular the requirements of optical transparency, mechanical flexibility and thermal stability when appropriate, the process according to the invention furthermore makes it possible to prevent any contamination and any topological perturbation of the face of the slabs on which the scintillator will be produced.

It should, however, be clear that the invention is not limited just to the embodiment examples specifically described, in particular with reference to FIGS. 4 and 5. In particular, the number of slabs which are assembled may be different from four, which corresponds to a conventional matrix configuration (2×2 slabs). This number is at least equal to two.

What is claimed is:

1. Process for producing a radiation detector consisting of the combination of a photosensitive component and a scintillator, the said photosensitive component consisting of at least two unitary elementary slabs, each unitary elementary slab containing a plurality of active elements or pixels and the edges of two adjacent slabs being separated by a determined inter-slab space, the process comprising at least the following phases:

a/ juxtaposition of the said unitary elementary slabs on a positioning substrate in order to form a composite slab of larger size whose unitary elementary slabs are separated from one another by the said determined inter-slab space, the said plurality of active elements or pixels being turned towards the positioning substrate;

b/ adhesively bonding the said composite slab onto a common support;

characterized in that the said adhesive-bonding phase comprises, in sequence:

a first adhesive-bonding step consisting in sealing the said determined inter-slab spaces by forming a bead of adhesive, leaving a free zone between its lower end and the said positioning substrate;

and a second adhesive-bonding step consisting in spreading a film of adhesive covering the said unitary elementary slabs and the said bead of sealing adhesive.

2. Process according to claim 1, characterized in that the adhesive used in the first step is a high-viscosity adhesive, and the adhesive used in the second step is an adhesive with much lower viscosity.

3. Process according to claim 2, characterized in that the adhesive used to carry out the said sealing in the first step is a thixotropic silicon resin or gel.

4. Radiography detector, characterized in that it is produced according to the process of claim 3.

5. Radiography detector, characterized in that it is produced according to the process of claim 2.

6. Process according to claim 1, characterized in that the adhesive spread during the second adhesive-bonding step in order to form the said film is a two-component silicon resin which can be polymerized by polyaddition.

7. Radiography detector, characterized in that it is produced according to the process of claim 6.

8. Process according to claim 1, characterized in that the adhesive used to carry out the said sealing in the first step and the adhesive spread during the second adhesive-bonding step in order to form the said film are both based on two-component silicon resin which can be polymerized by polyaddition, and in that the first adhesive-bonding step consists in introducing partially polymerized resin into the said determined inter-slab spaces so that it does not penetrate as far as the bottom of these inter-slab spaces, and in that the second adhesive-bonding step consists in spreading as yet unpolymerized resin over the surface of the said composite slab, so that it is in the fluid state in order to obtain uniform spreading.

9. Radiography detector, characterized in that it is produced according to the process of claim 8.

10. Radiography detector, characterized in that it is produced according to the process of claim 1.

* * * * *